(12) United States Patent
Arflack et al.

(10) Patent No.: US 9,307,836 B2
(45) Date of Patent: Apr. 12, 2016

(54) ADJUSTABLE 4-POST RACK

(71) Applicant: Panduit Corp., Tinley Park, IL (US)

(72) Inventors: Brian K Arflack, Burr Ridge, IL (US);
Eleobardo Moreno, St. John, IN (US);
Clark M Kromenaker, Yorkville, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 14/109,482

(22) Filed: Dec. 17, 2013

(65) Prior Publication Data

US 2014/0190910 A1  Jul. 10, 2014

Related U.S. Application Data

(60) Provisional application No. 61/750,129, filed on Jan. 8, 2013.

(51) Int. Cl.
 *A47B 55/00* (2006.01)
 *H05K 7/14* (2006.01)
 *H05K 7/18* (2006.01)

(52) U.S. Cl.
 CPC .............. *A47B 55/00* (2013.01); *H05K 7/1488* (2013.01); *H05K 7/18* (2013.01)

(58) Field of Classification Search
 CPC .. A47B 45/00; A47B 47/0008; H05K 7/1488; H05K 7/1489; H05K 7/18; H05K 7/183
 USPC ......... 211/26, 175, 183, 189; 312/265.1–265, 312/4; 361/724, 727, 829
 See application file for complete search history.

(56) References Cited

U.S. PATENT DOCUMENTS

| | | | | |
|---|---|---|---|---|
| 3,297,383 | A * | 1/1967 | Fay | 312/265.4 |
| 4,715,502 | A * | 12/1987 | Salmon | 211/26 |
| 4,869,380 | A * | 9/1989 | Metcalfe et al. | 211/189 |
| 5,326,162 | A * | 7/1994 | Bovermann | 312/265.3 |
| 5,542,549 | A * | 8/1996 | Siemon et al. | 211/26 |
| 5,806,945 | A * | 9/1998 | Anderson et al. | 312/265.3 |
| 6,206,494 | B1 * | 3/2001 | Benner | H02B 1/301 174/50 |
| 6,223,908 | B1 | 5/2001 | Kurtsman | |
| 6,478,166 | B2 | 11/2002 | Hung | |
| 6,591,997 | B2 * | 7/2003 | Hung | 211/183 |
| 6,655,533 | B2 | 12/2003 | Guebre-Tsadik | |
| 6,655,534 | B2 * | 12/2003 | Williams et al. | 211/26 |
| 2002/0046979 | A1 * | 4/2002 | Larsen et al. | 211/26 |
| 2002/0117462 | A1 * | 8/2002 | Hung | 211/189 |
| 2002/0153335 | A1 * | 10/2002 | Robideau | 211/26 |
| 2003/0062326 | A1 * | 4/2003 | Guebre-Tsadik | 211/26 |
| 2003/0071002 | A1 * | 4/2003 | Hung | 211/183 |
| 2004/0183409 | A1 * | 9/2004 | Rinderer | 312/265.4 |
| 2005/0211647 | A1 * | 9/2005 | Palker et al. | 211/26 |
| 2007/0175835 | A1 * | 8/2007 | Liang | 211/26 |
| 2010/0110621 | A1 * | 5/2010 | Dunn et al. | 361/679.01 |
| 2012/0068031 | A1 * | 3/2012 | Phelan et al. | 248/224.8 |
| 2012/0250261 | A1 * | 10/2012 | Peng et al. | 361/724 |
| 2013/0213907 | A1 * | 8/2013 | Masse et al. | 211/26 |
| 2013/0249363 | A1 * | 9/2013 | Liu | 312/265.1 |

* cited by examiner

*Primary Examiner* — Joshua Rodden
(74) *Attorney, Agent, or Firm* — Christopher S. Clancy; James H. Williams

(57) ABSTRACT

A rack is provided. The rack includes a vertical post and an equipment rail removably connected to the vertical post.

13 Claims, 23 Drawing Sheets

ADJUSTABLE 4-POST RACK

CROSS REFERENCE TO RELATED APPLICATIONS

This application claims the benefit of U.S. Provisional Patent Application No. 61/750,129, filed on Jan. 8, 2013, which is incorporated by reference in its entirety.

BACKGROUND OF THE INVENTION

The present invention relates to an adjustable 4-post rack, and more particularly, an adjustable 4-post rack having improved stability.

Adjustable 4-post racks are well known in the art. For example, U.S. Pat. No. 6,223,908 ("the '908 patent"), discloses an adjustable 4-post rack. However, the adjustable 4-post rack of the '908 patent includes U-shaped vertical posts, which include open sides, and therefore, are inherently unstable.

Therefore, there is a need for an adjustable 4-post rack having improved stability.

SUMMARY OF THE INVENTION

A rack is provided. The rack includes a vertical post and an equipment rail removably connected to the vertical post.

DETAILED DESCRIPTION

Figure 1:
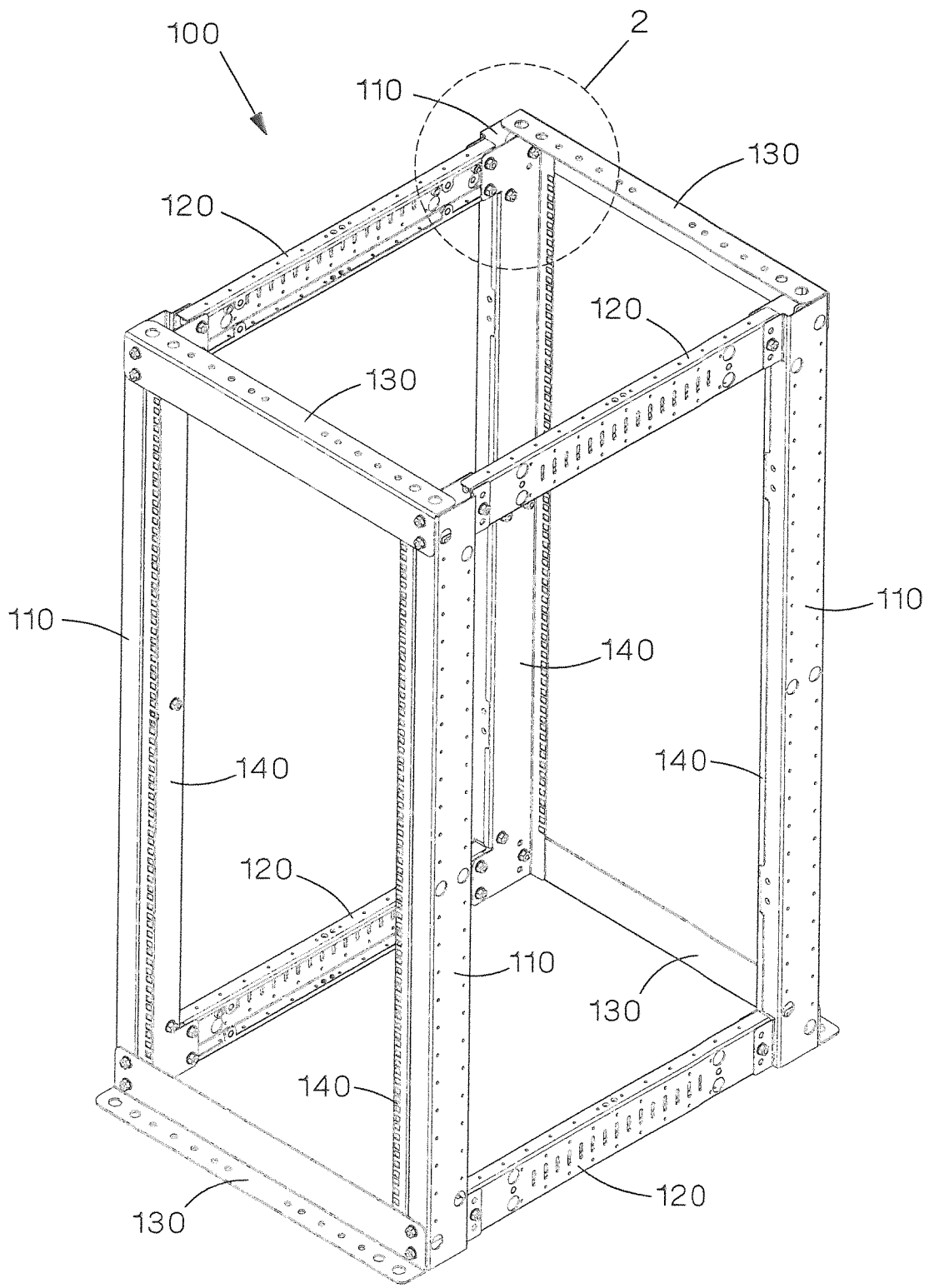
FIG. 1 is a perspective view of an adjustable 4-post rack according to a first embodiment of the present invention, showing the adjustable 4-post rack at a maximum depth.
Figure 2:
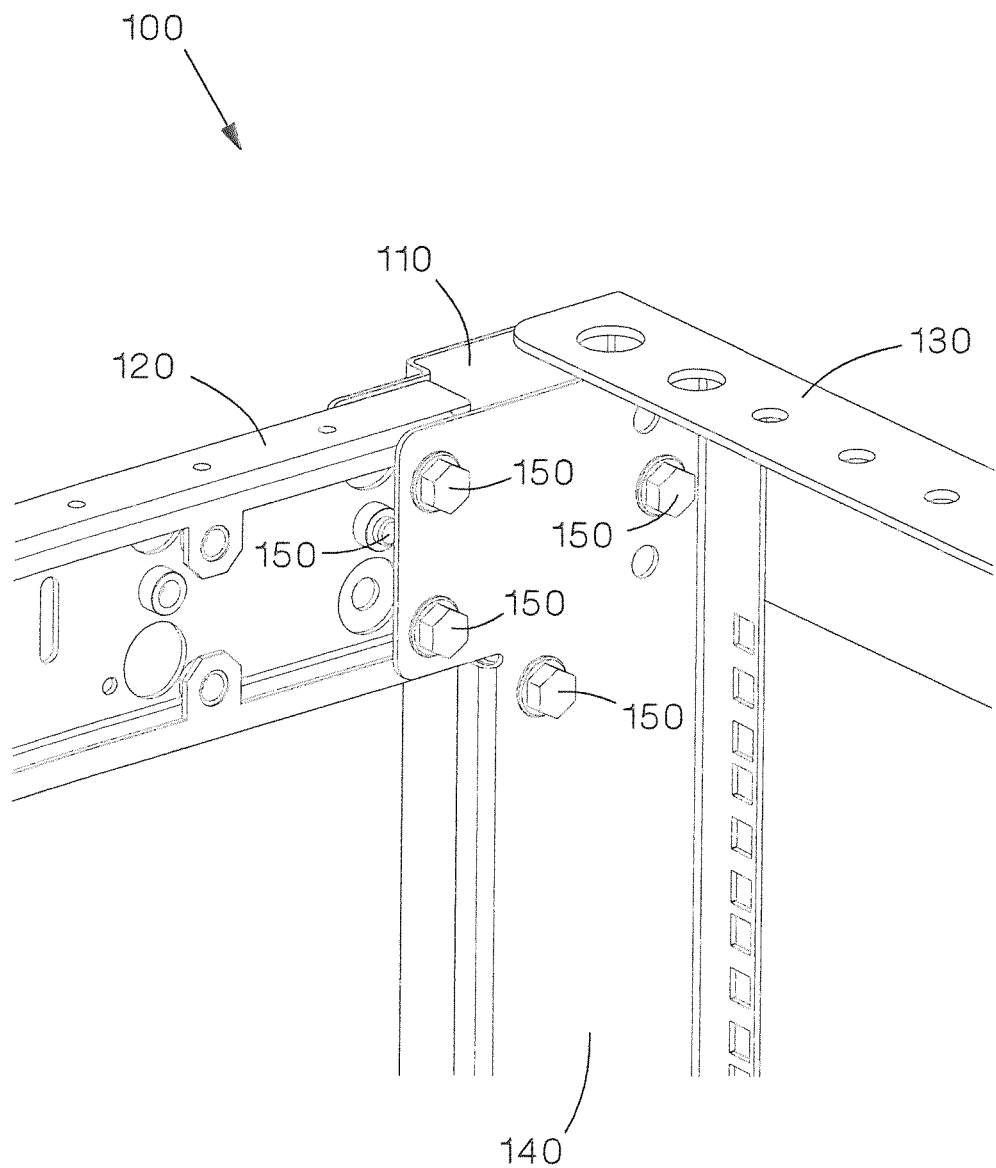
FIG. 2 is an enlarged view of detail 2 of FIG. 1.
Figure 3:
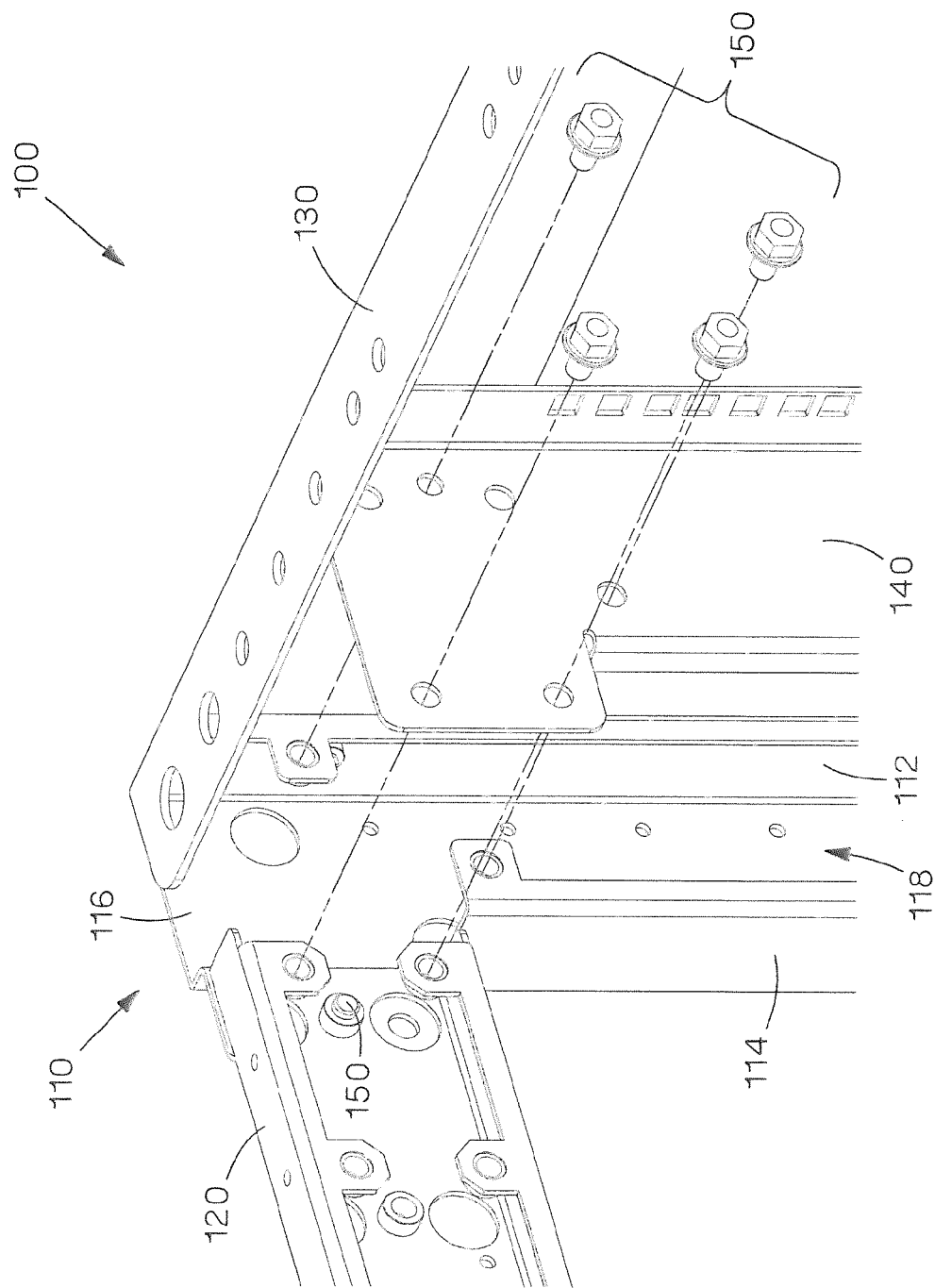
FIG. 3 is a partially exploded view of FIG. 2.
Figure 4:
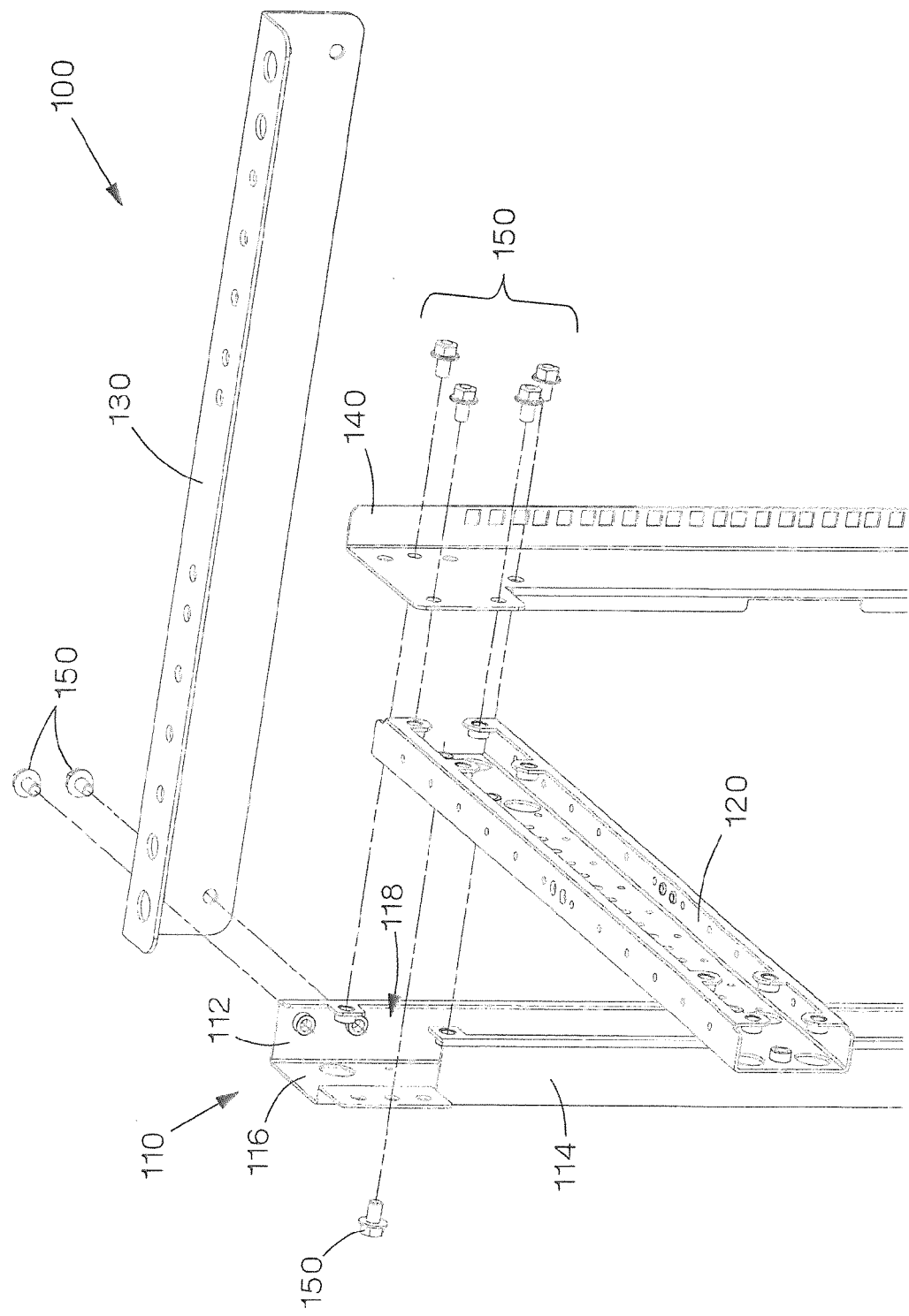
FIG. 4 is an exploded view of the top back left corner of the adjustable 4-post rack of FIG. 1.
Figure 5:
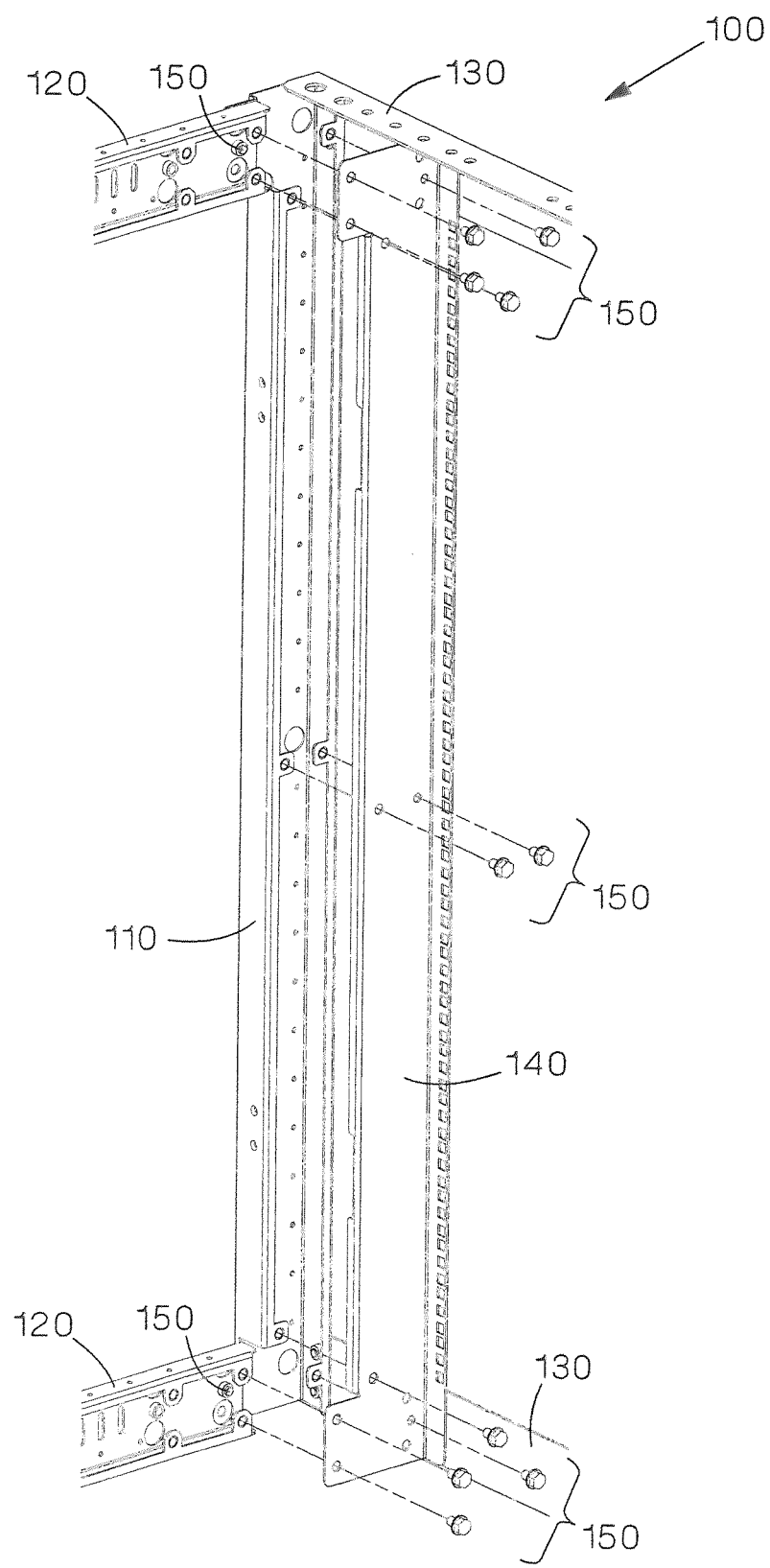
FIG. 5 is a partially exploded view of the back left corner of the adjustable 4-post rack of FIG. 1.

FIGS. 1-8 illustrate an adjustable 4-post rack 100 according to a first embodiment of the present invention.

As shown in FIGS. 1-8, adjustable 4-post rack 100 includes vertical posts 110, front-to-back beams 120, side-to-side beams 130, and equipment rails 140, which are assembled, using fasteners 150, to form adjustable 4-post rack 100.

Preferably, each of the components of adjustable 4-post rack 100, such as vertical posts 110, front-to-back beams 120, side-to-side beams 130, equipment rails 140, and fasteners 150, is identical, and therefore, interchangeable, facilitating assembly of adjustable 4-post rack 100, as well as reducing manufacturing costs.

Figure 6:
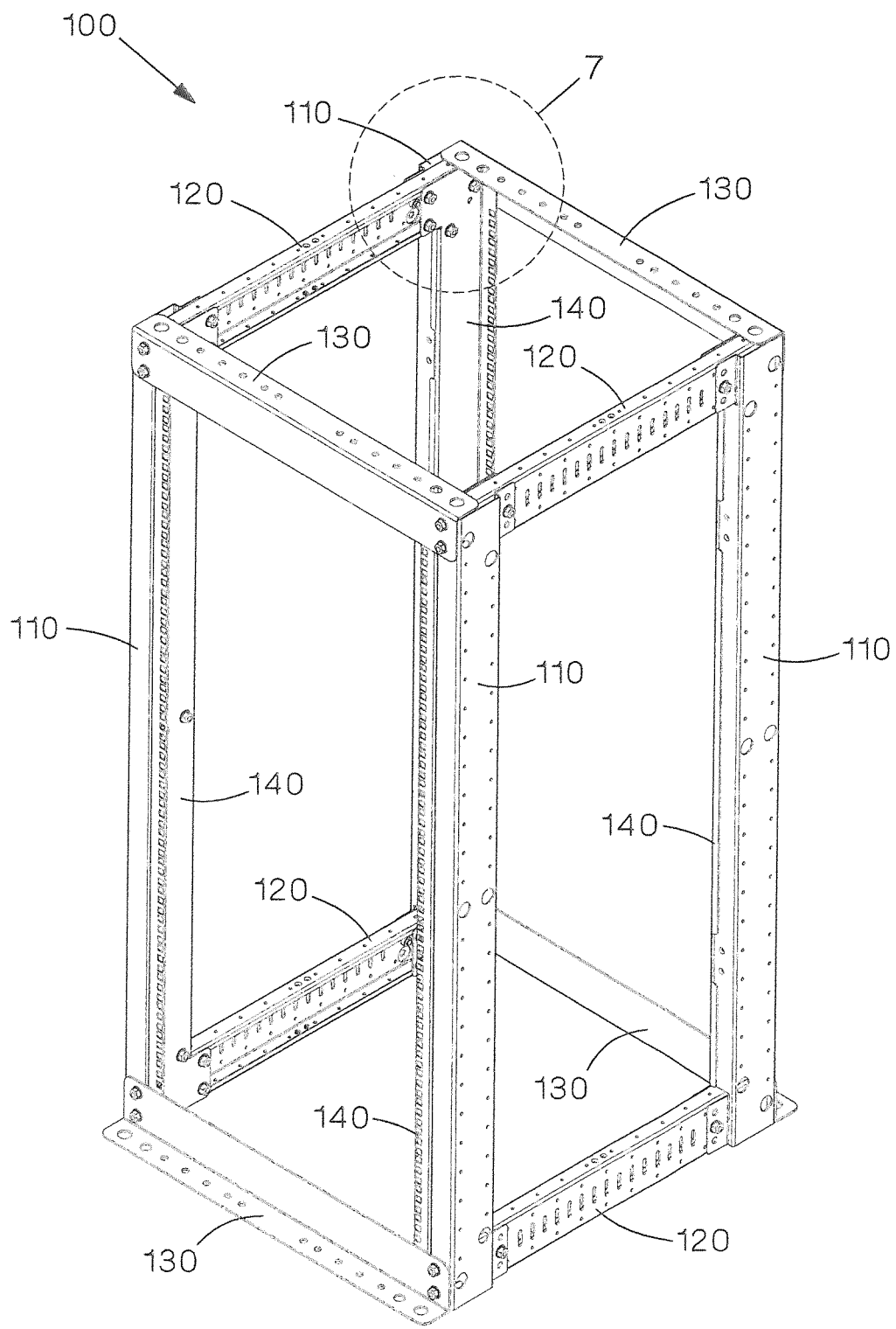
FIG. 6 is a perspective view of the 4-post rack of FIG. 1, showing the 4-post rack at a minimum depth.
Figure 7:
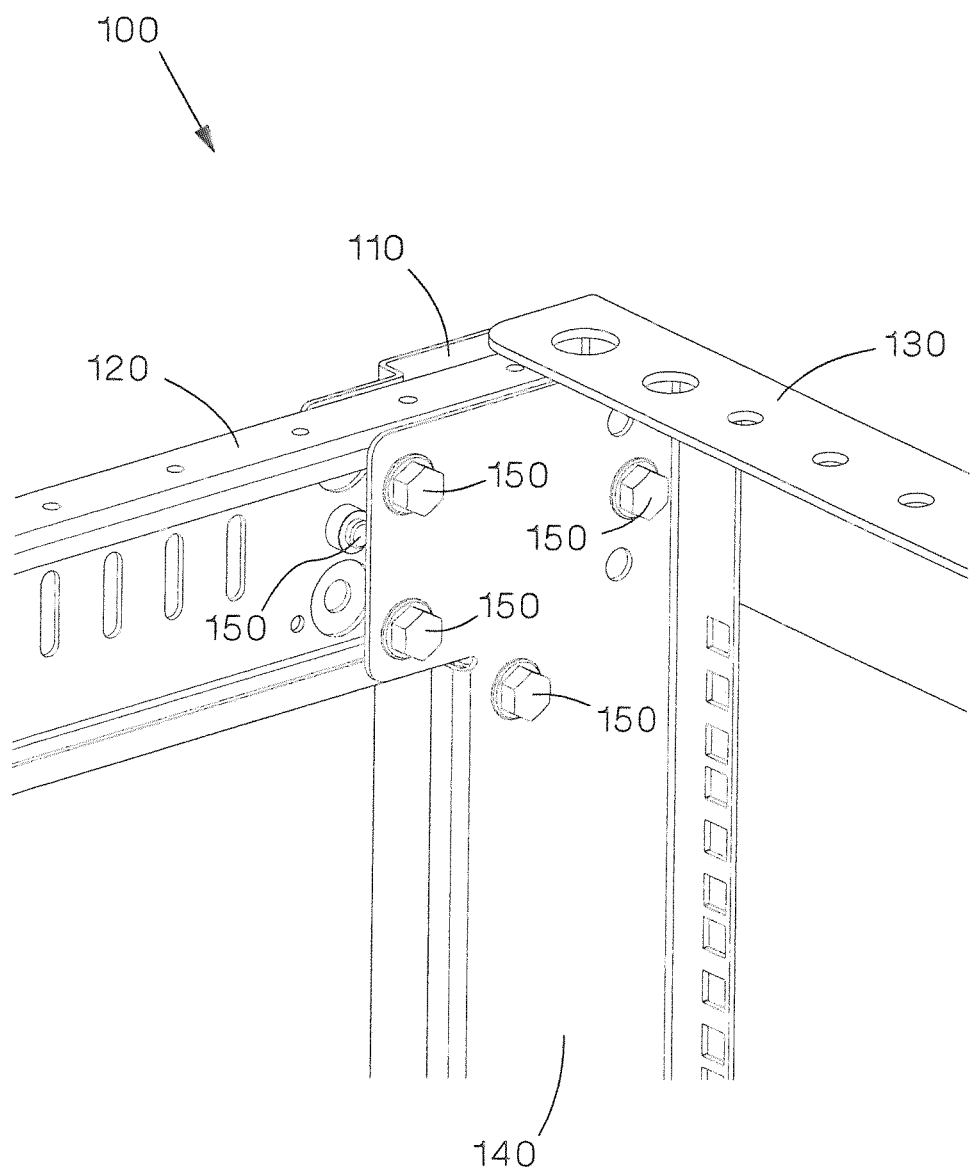
FIG. 7 is an enlarged view of detail 7 of FIG. 6.
Figure 8:
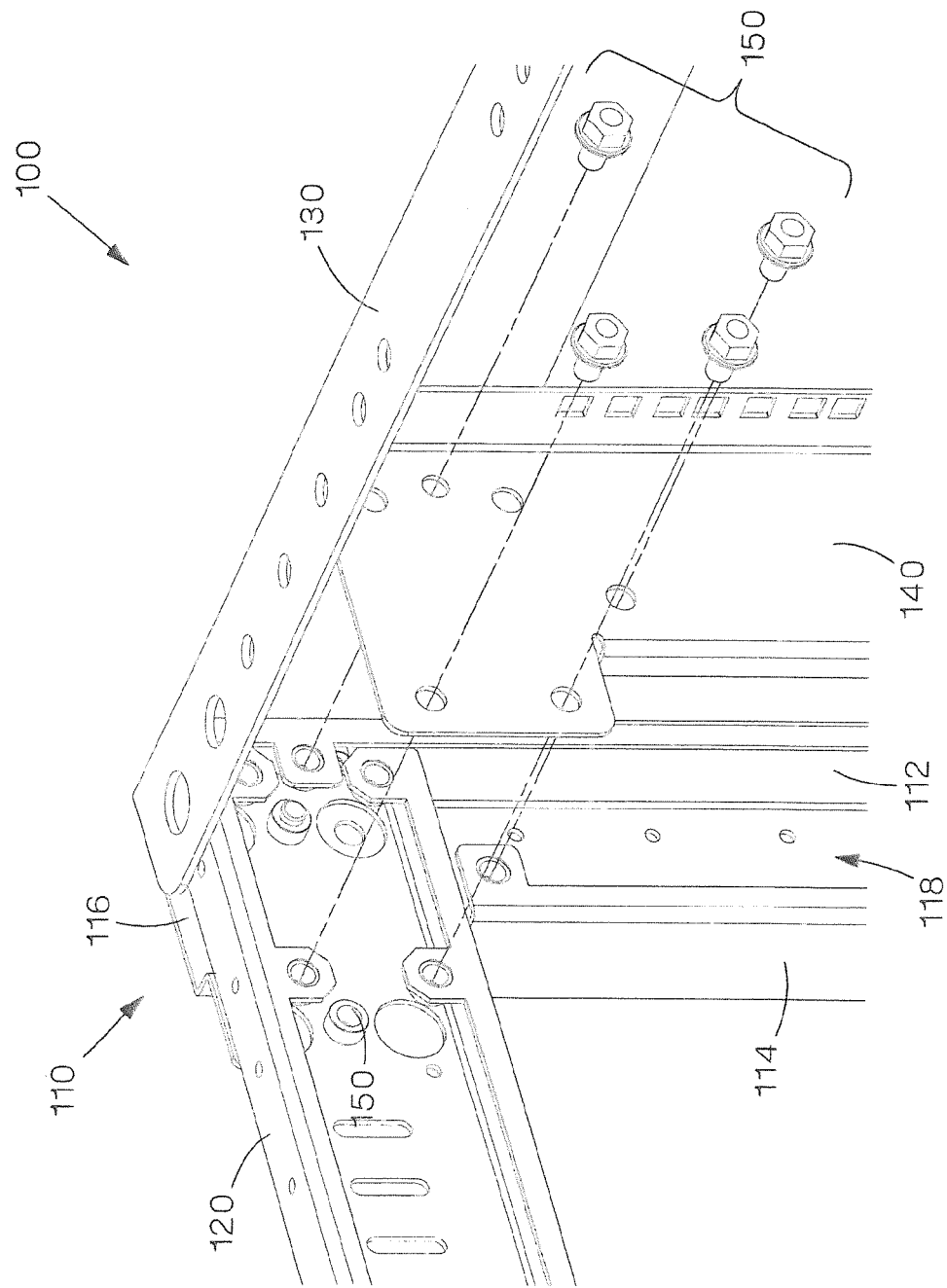
FIG. 8 is a partially exploded view of FIG. 7.
Figure 9:
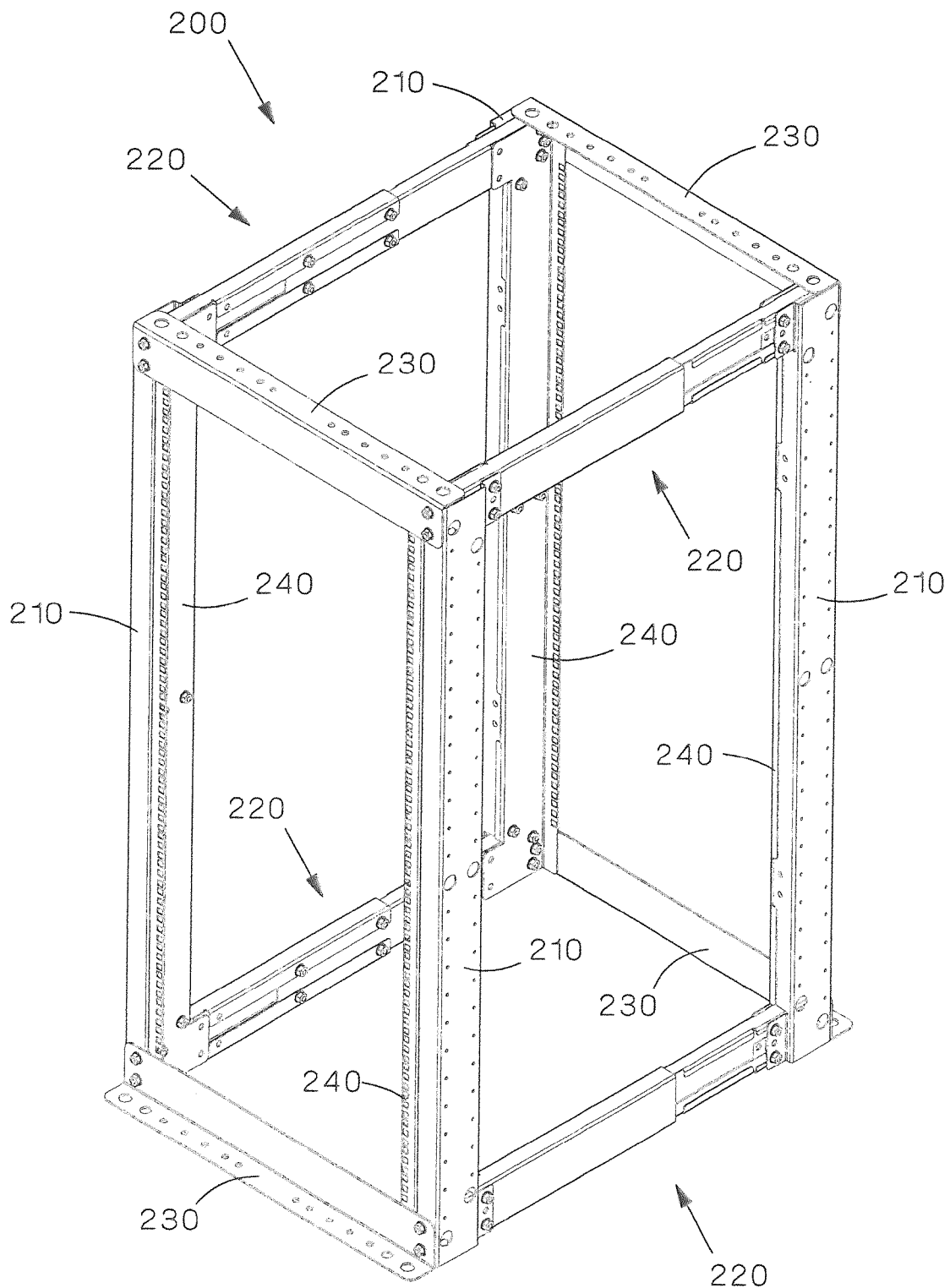
FIG. 9 is a top front perspective view of an adjustable 4-post rack according to a second embodiment of the present invention, showing the adjustable 4-post rack at a maximum depth.
Figure 10:
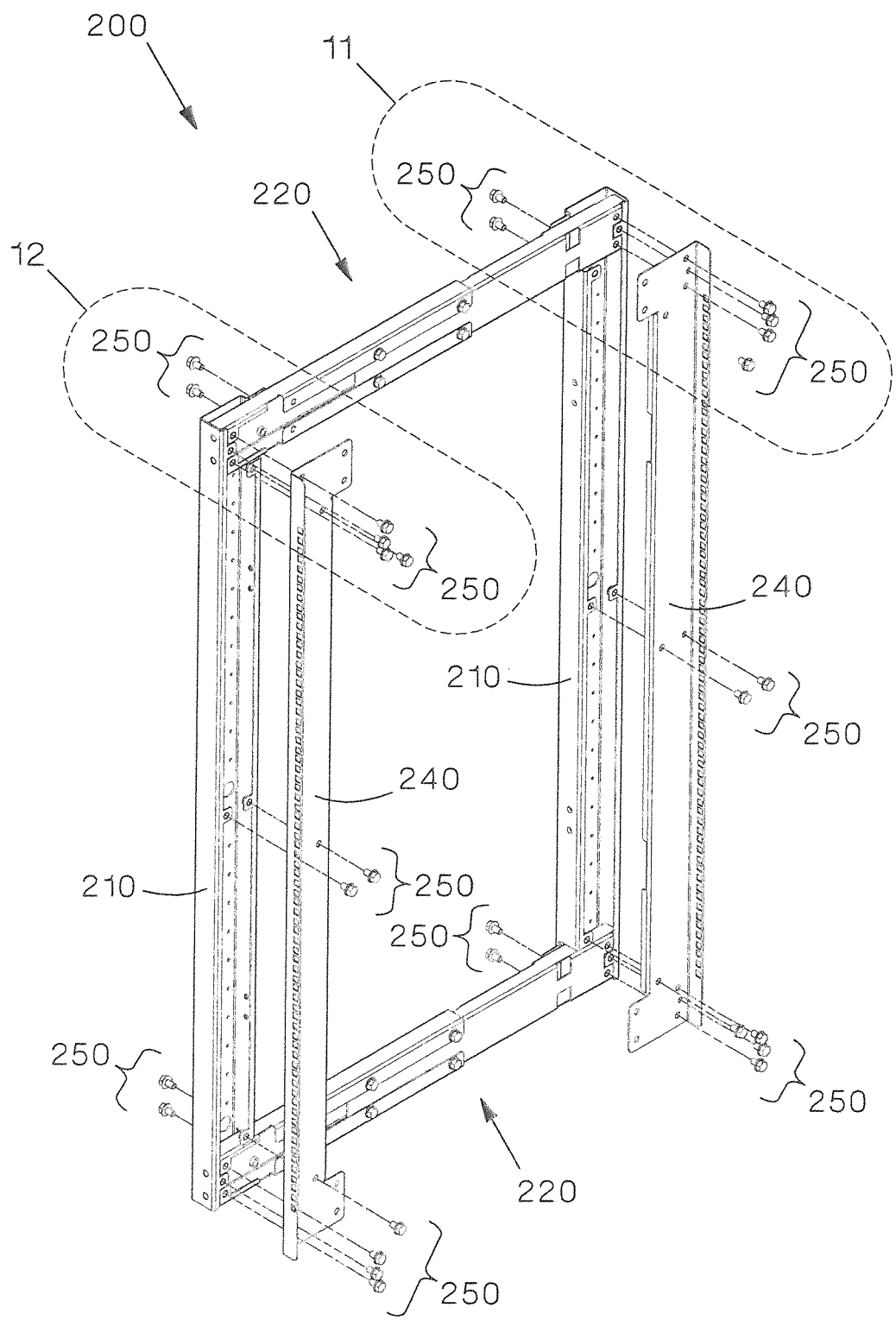
FIG. 10 is a partially exploded top front perspective view of the left side of the adjustable 4-post rack of FIG. 9, showing the equipment rails partially assembled.
Figure 11:
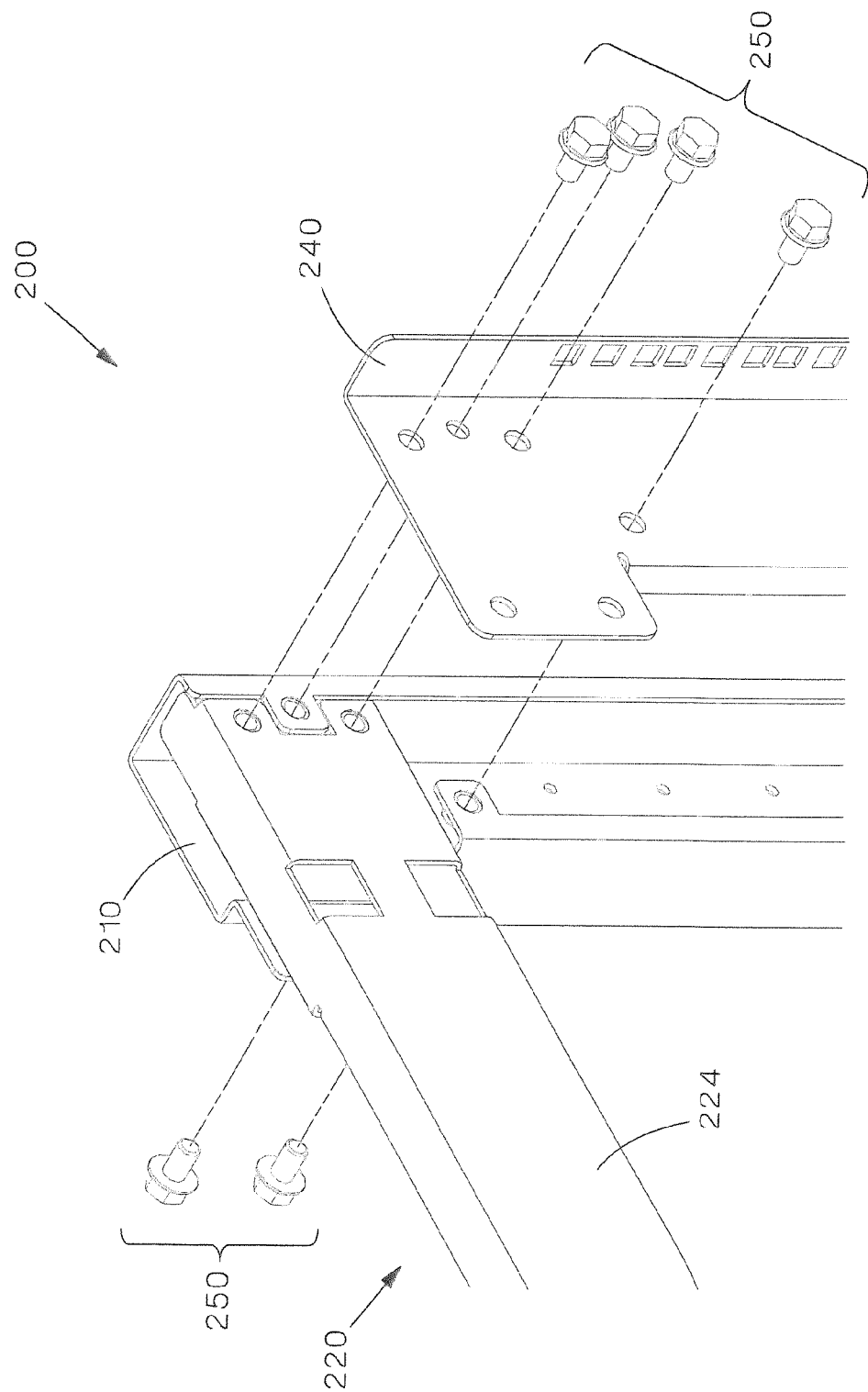
FIG. 11 is an enlarged view of detail 11 of FIG. 10.
Figure 12:
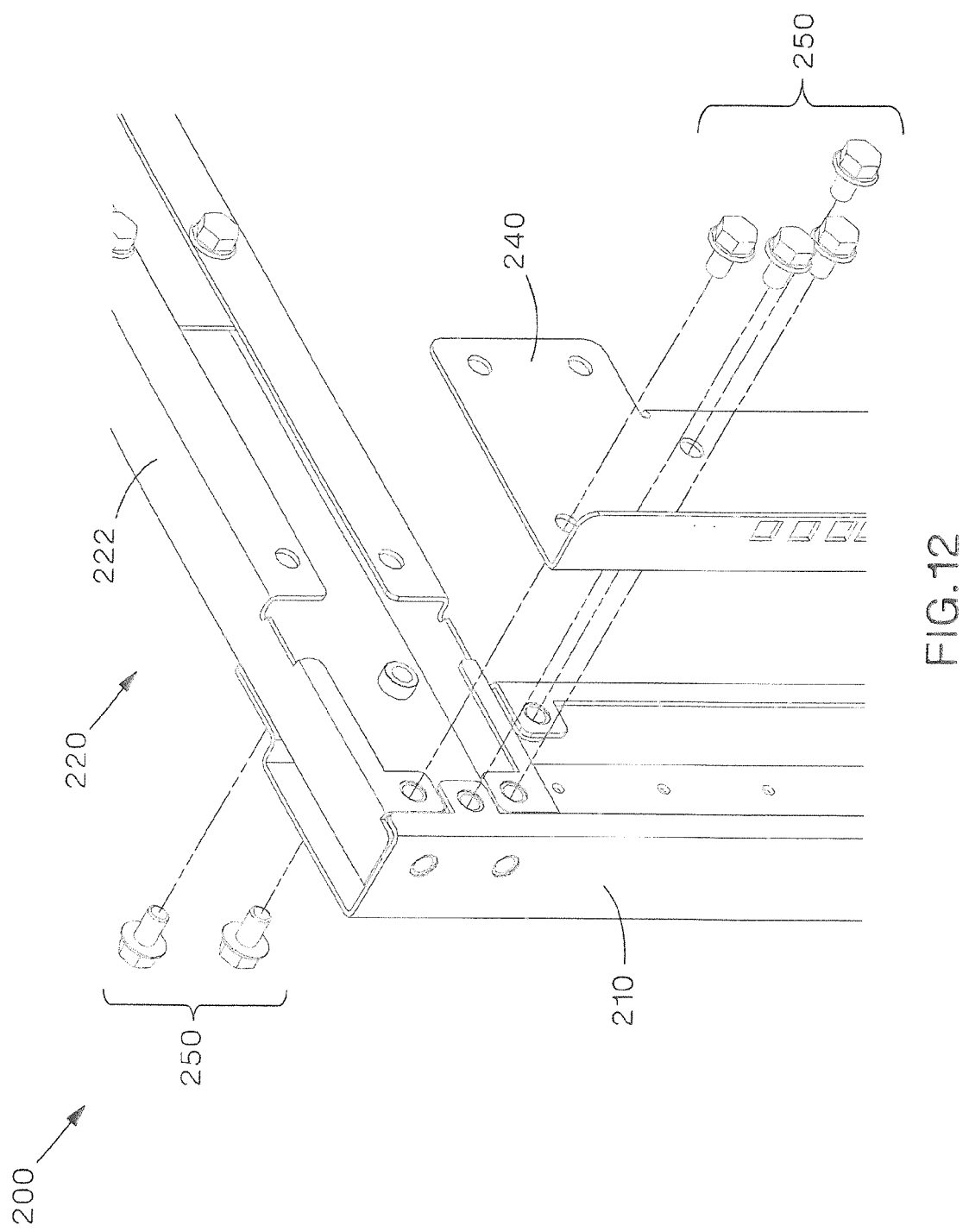
FIG. 12 is an enlarged view of detail 12 of FIG. 10.
Figure 13:
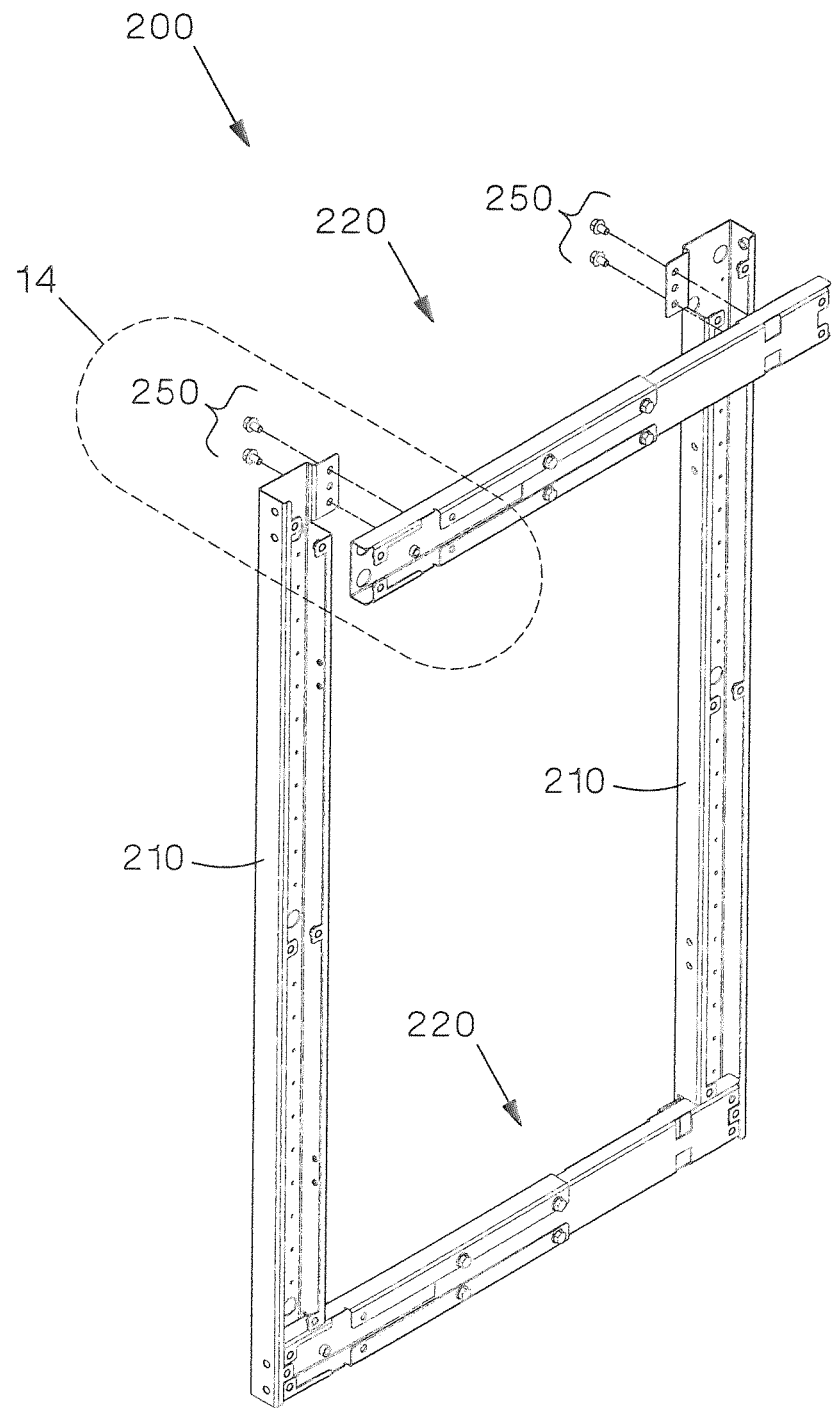
FIG. 13 is a partially exploded top front perspective view of the left side of the adjustable 4-post rack of FIG. 9, showing the front-to-back beams partially assembled.
Figure 14:
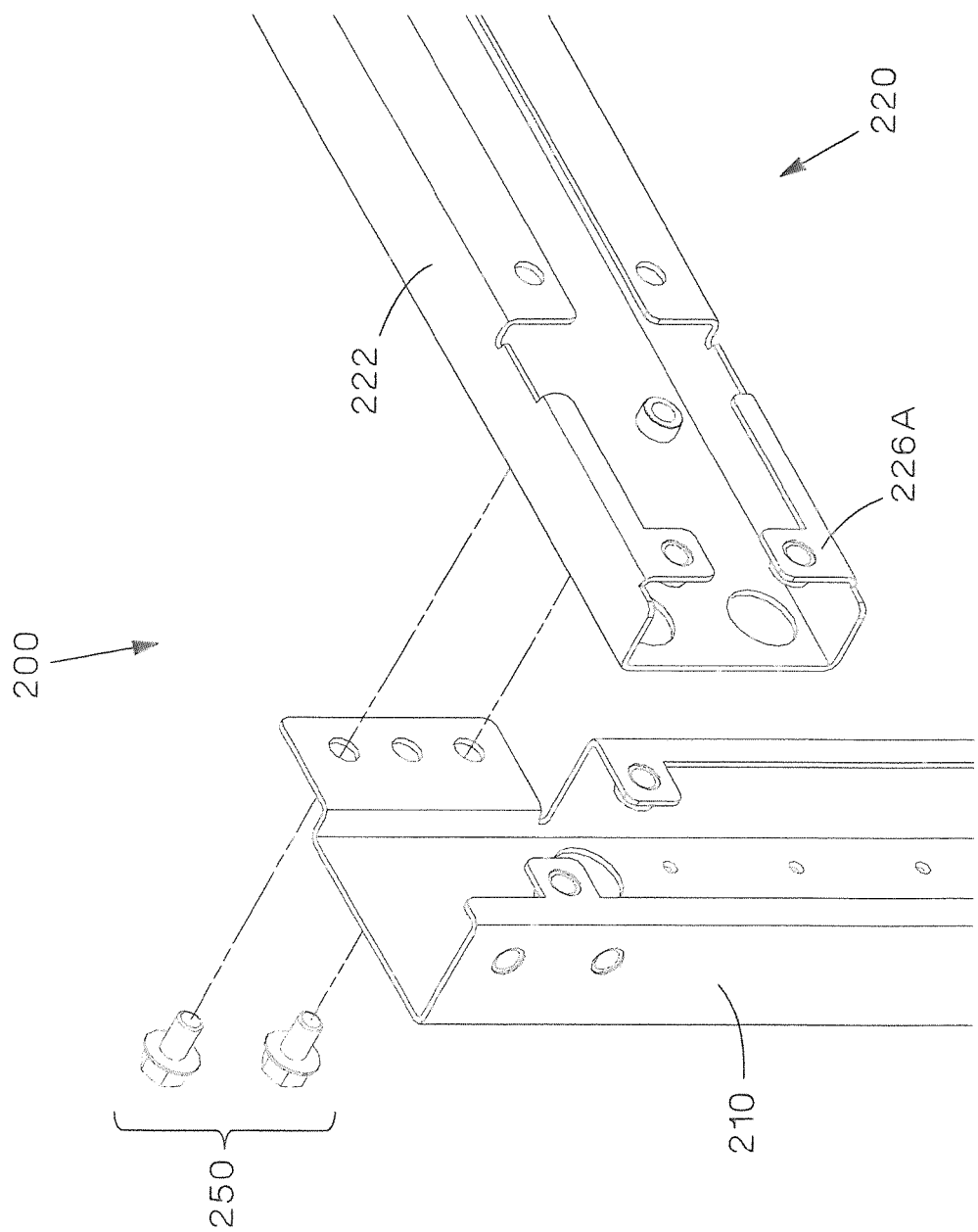
FIG. 14 is an enlarged view of detail 14 of FIG. 13.
Figure 15:
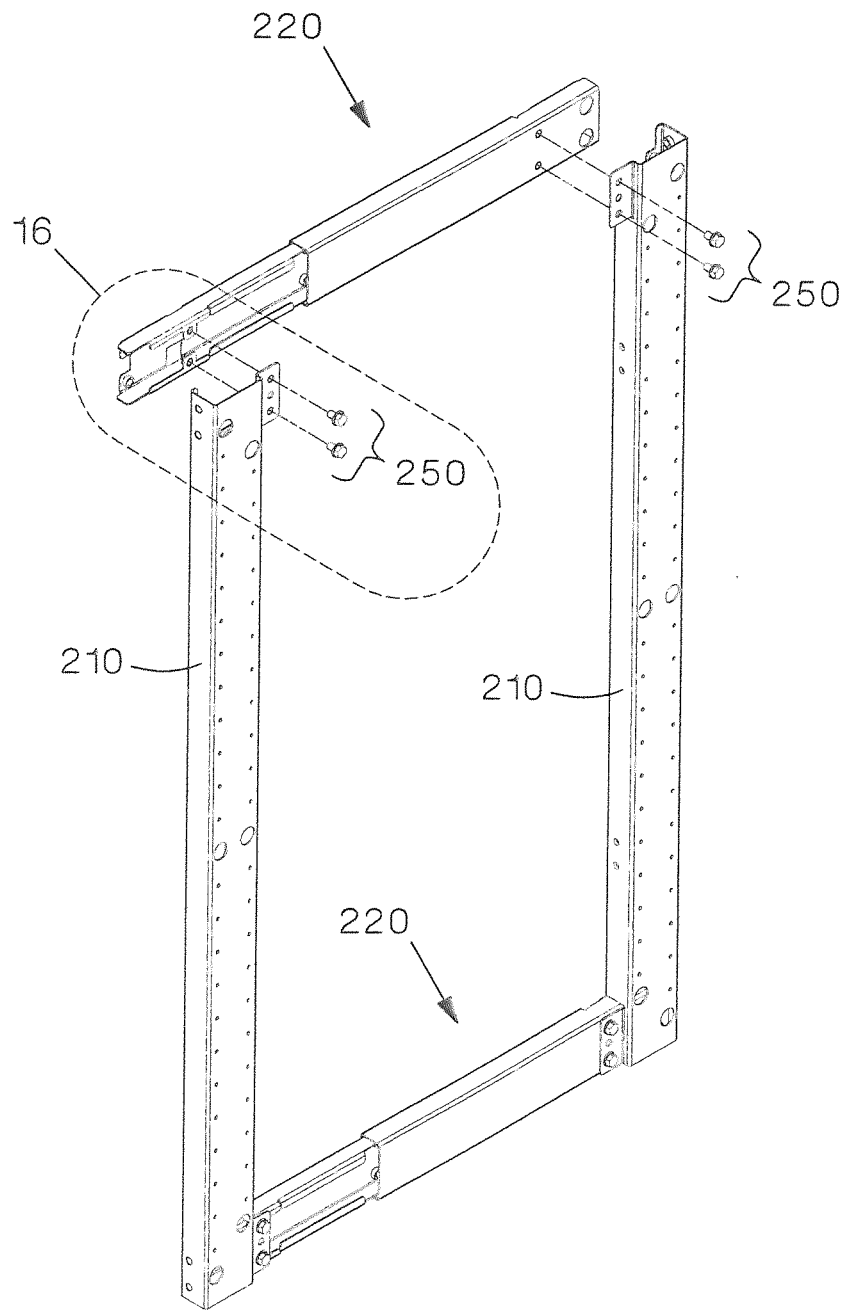
FIG. 15 is a partially exploded top back perspective view of the left side of the adjustable 4-post rack of FIG. 9, showing the front-to-back beams partially assembled.
Figure 16:
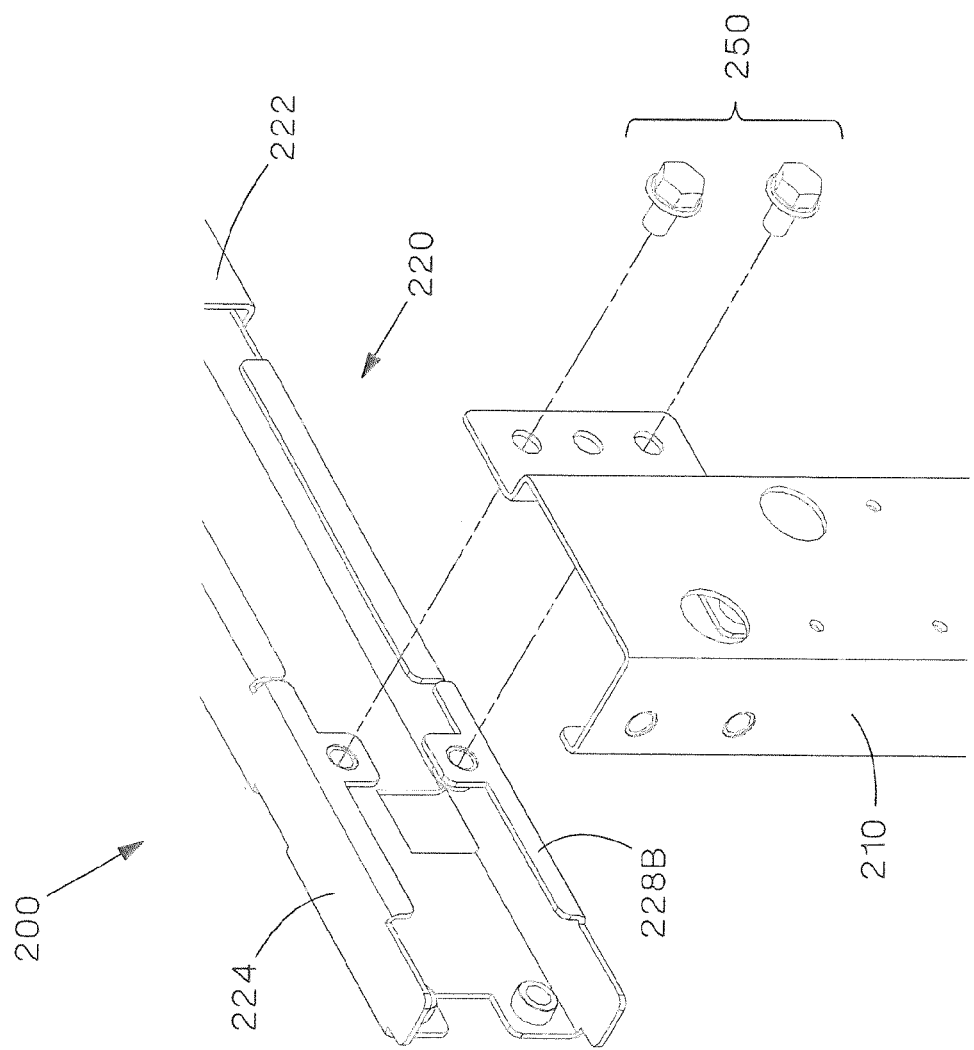
FIG. 16 is an enlarged view of detail 16 of FIG. 15.
Figure 17:
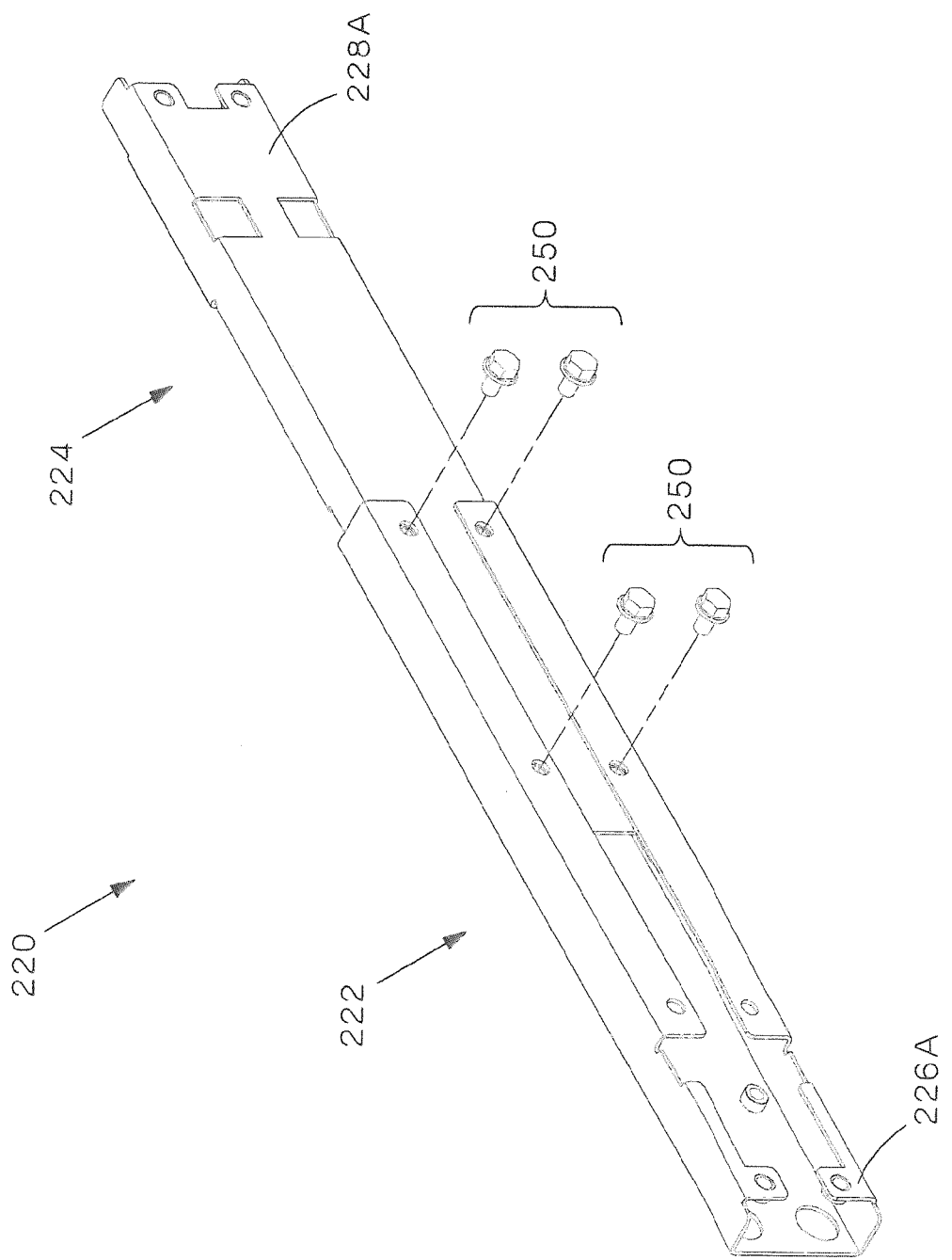
FIG. 17 is a top front perspective view of a front-to-back beam positioned for the left side of the adjustable 4-post rack of FIG. 9.
Figure 18:
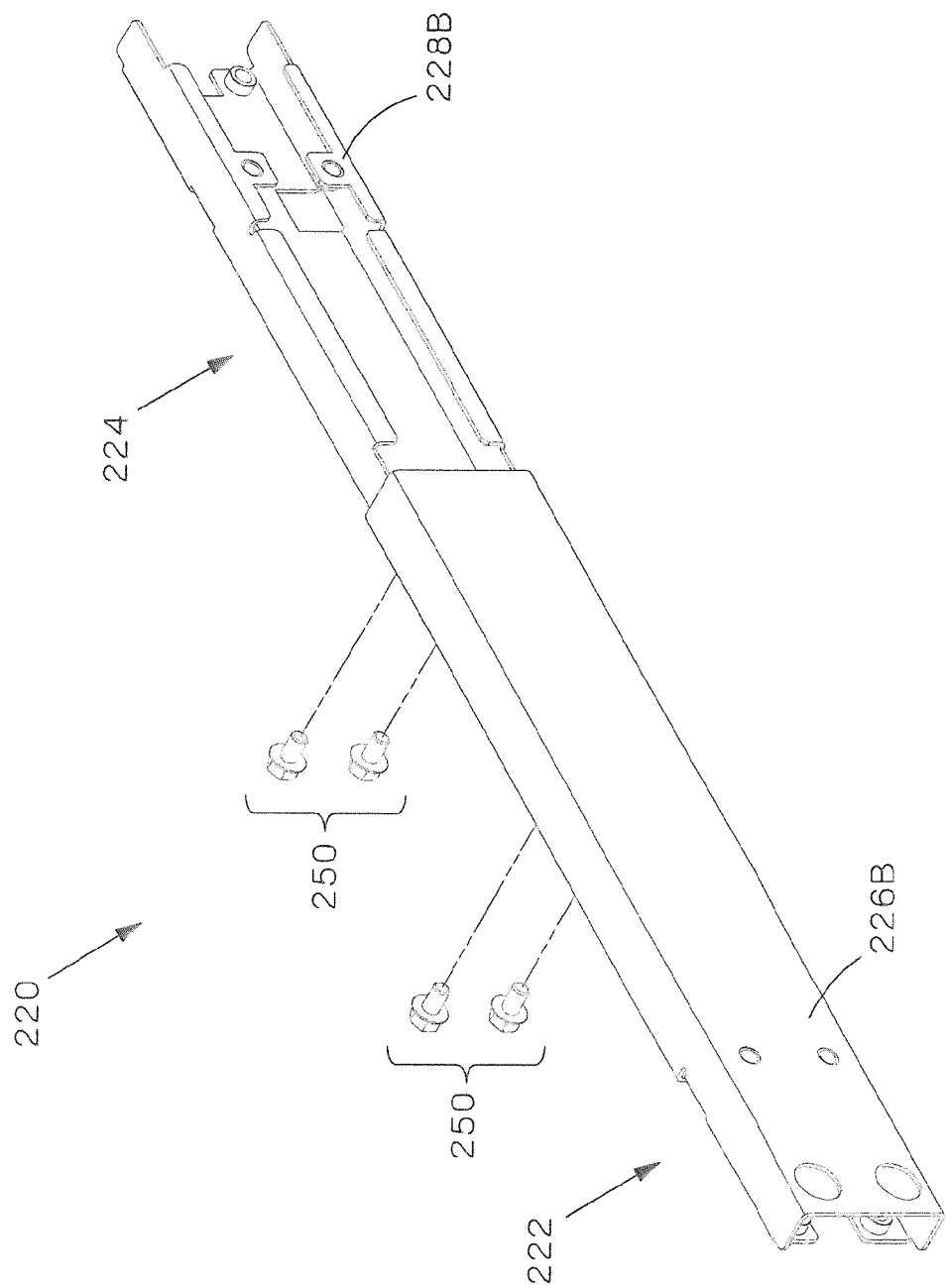
FIG. 18 is a top front perspective view of the front-to-back beam of FIG. 17 positioned for the right side of the adjustable 4-post rack of FIG. 9.

As shown in FIGS. 1-5, 4-post rack 100 is at a maximum depth, and as shown in FIGS. 6-8, 4-post rack 100 is at a minimum depth. That is, as shown in FIGS. 1-5, front-to-back beams 120 are removably connected to vertical post 110 at a maximum-depth position, and as shown in FIGS. 6-8, front-to-back beams 120 are removably connected to vertical posts 110 at a minimum-depth position.

While the minimum-depth position and the maximum-depth position are both stable, the minimum depth is more stable than the maximum depth, because, for example, front-to-back beam 120 extends further into vertical post 110.

Side-to-side beams 130 are removably connected to vertical posts 110, preferably, at a different location than front-to-back beams 120, facilitating adjustment of front-to-back beams 120.

Equipment rails 140 are removably connected to vertical posts 110, stabilizing vertical post 110, and therefore, adjustable 4-post rack 100. For example, vertical post 110 is U-shaped. That is, vertical post 110 includes a front 112, a back 114, and a side 116, which define an opening 118. Equipment rail 140 is removably connected to front 112 and back 114, and spans opening 118, stabilizing vertical post 110.

Additionally, equipment rails 140 are removably connected to front-to-back beams 120, further stabilizing the adjustable 4-post rack 100.

FIGS. 9-23 illustrate an adjustable 4-post rack 200 according to a second embodiment of the present invention.

As shown in FIGS. 9-23, adjustable 4-post rack 200 is similar to adjustable 4-post rack 100. That is, adjustable 4-post rack 200 includes verticals posts 210, front-to-back beams 220, side-to-side beams 230, equipment rails 240, and fasteners 250, which are similar to vertical posts 110, front-to-back beams 120, side-to-side beams 130, equipment rails 140, and fasteners 150, respectively, as described above with reference to FIGS. 1-8.

Figure 19:
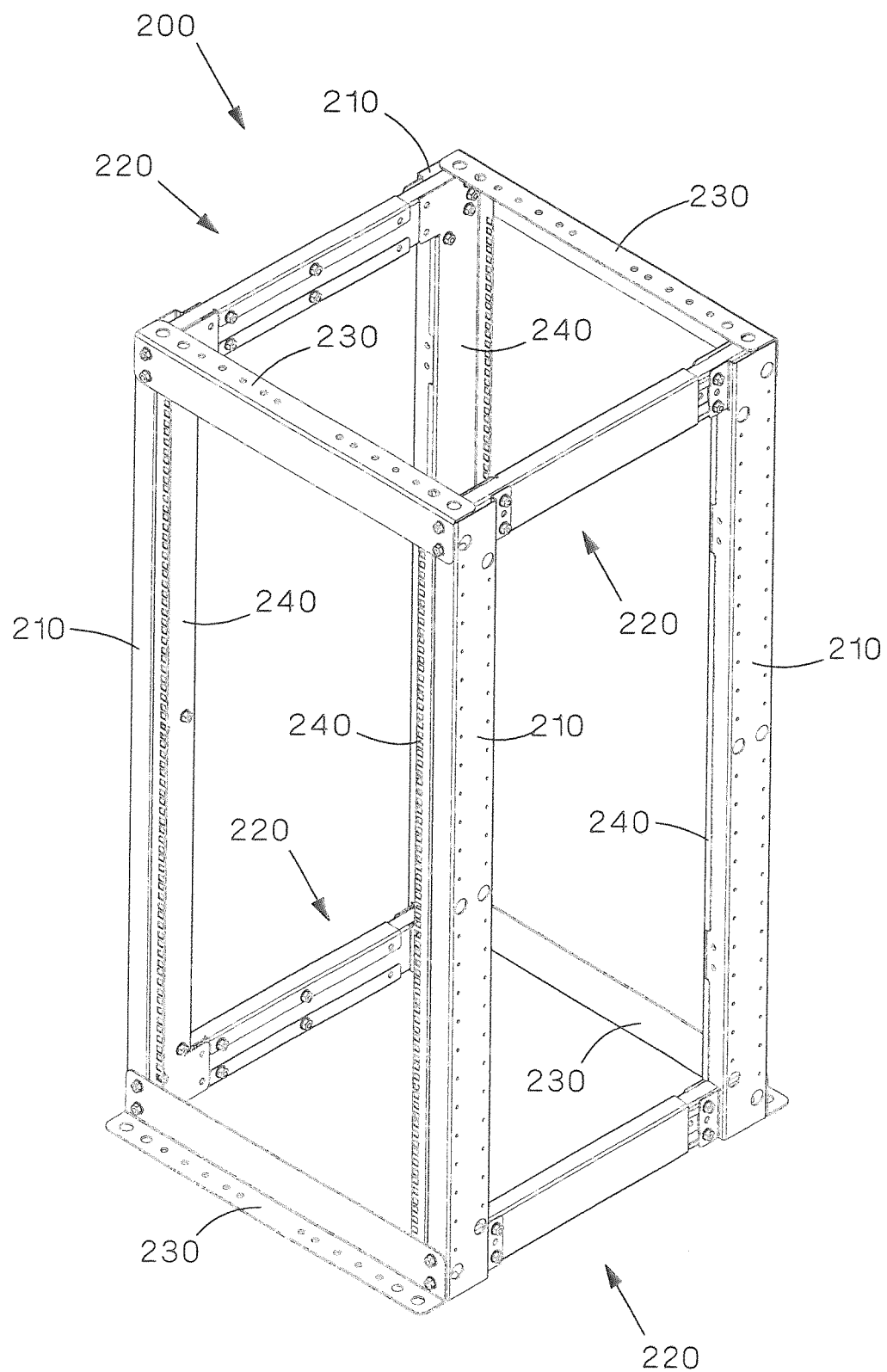
FIG. 19 is a top front perspective view of the adjustable 4-post rack of FIG. 9, showing the adjustable 4-post rack at a minimum depth.
Figure 20:
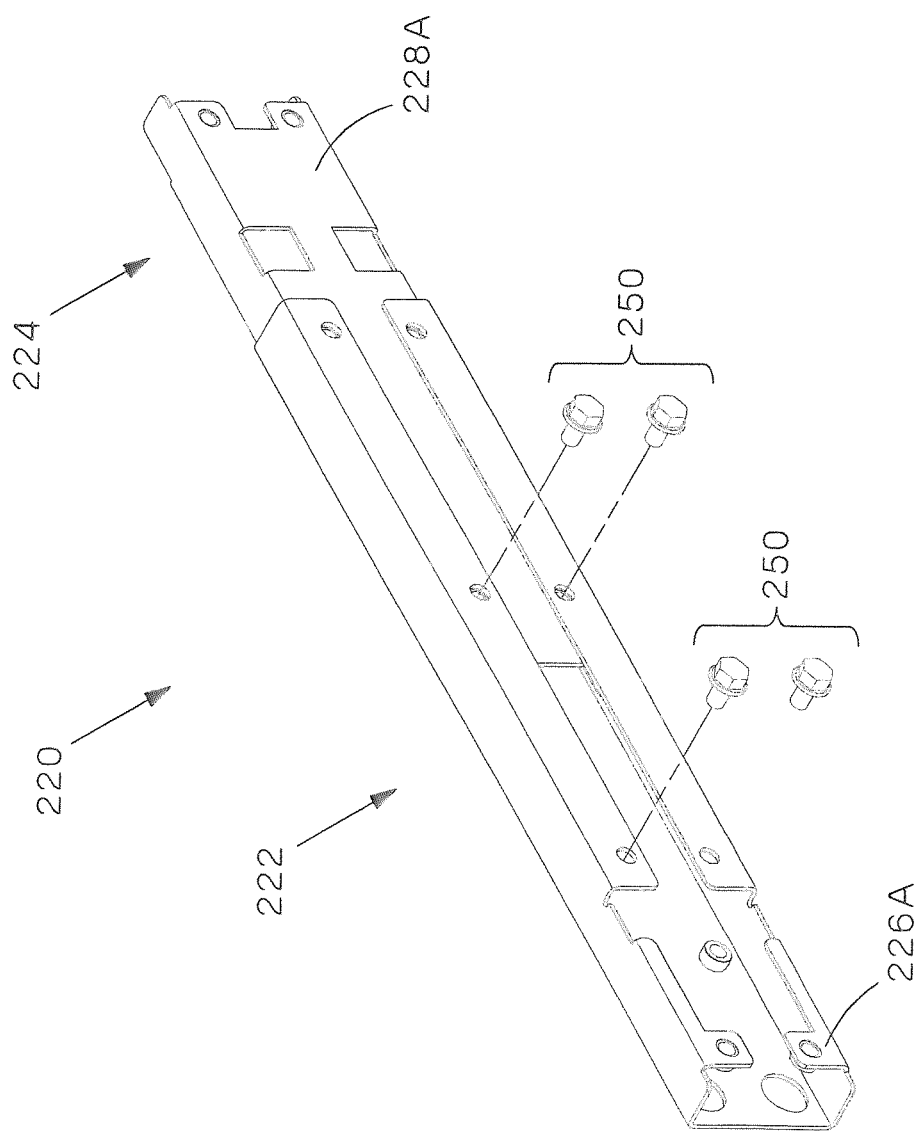
FIG. 20 is a top front perspective view of a front-to-back beam positioned for the left side of the adjustable 4-post rack of FIG. 19.
Figure 21:
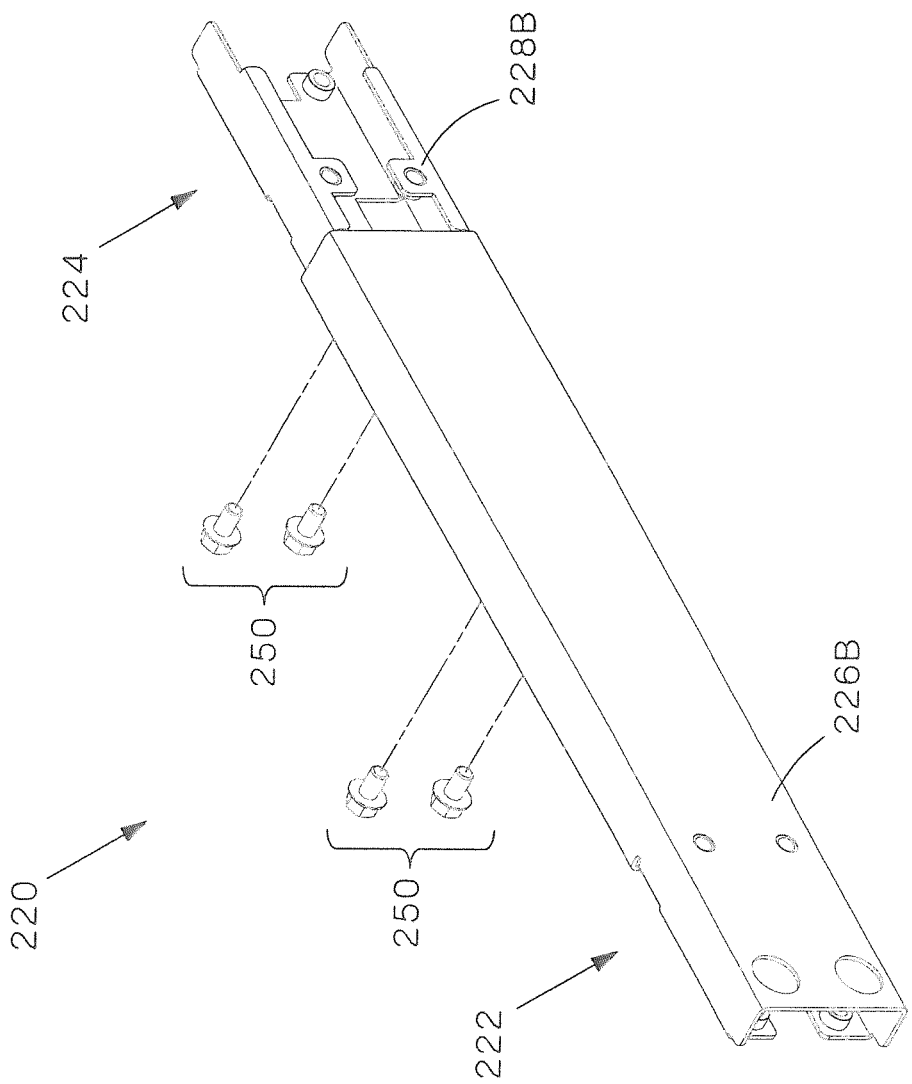
FIG. 21 a top front perspective view of the front-to-back beam of FIG. 20 positioned for the right side of the adjustable 4-post rack of FIG. 19.
Figure 22:
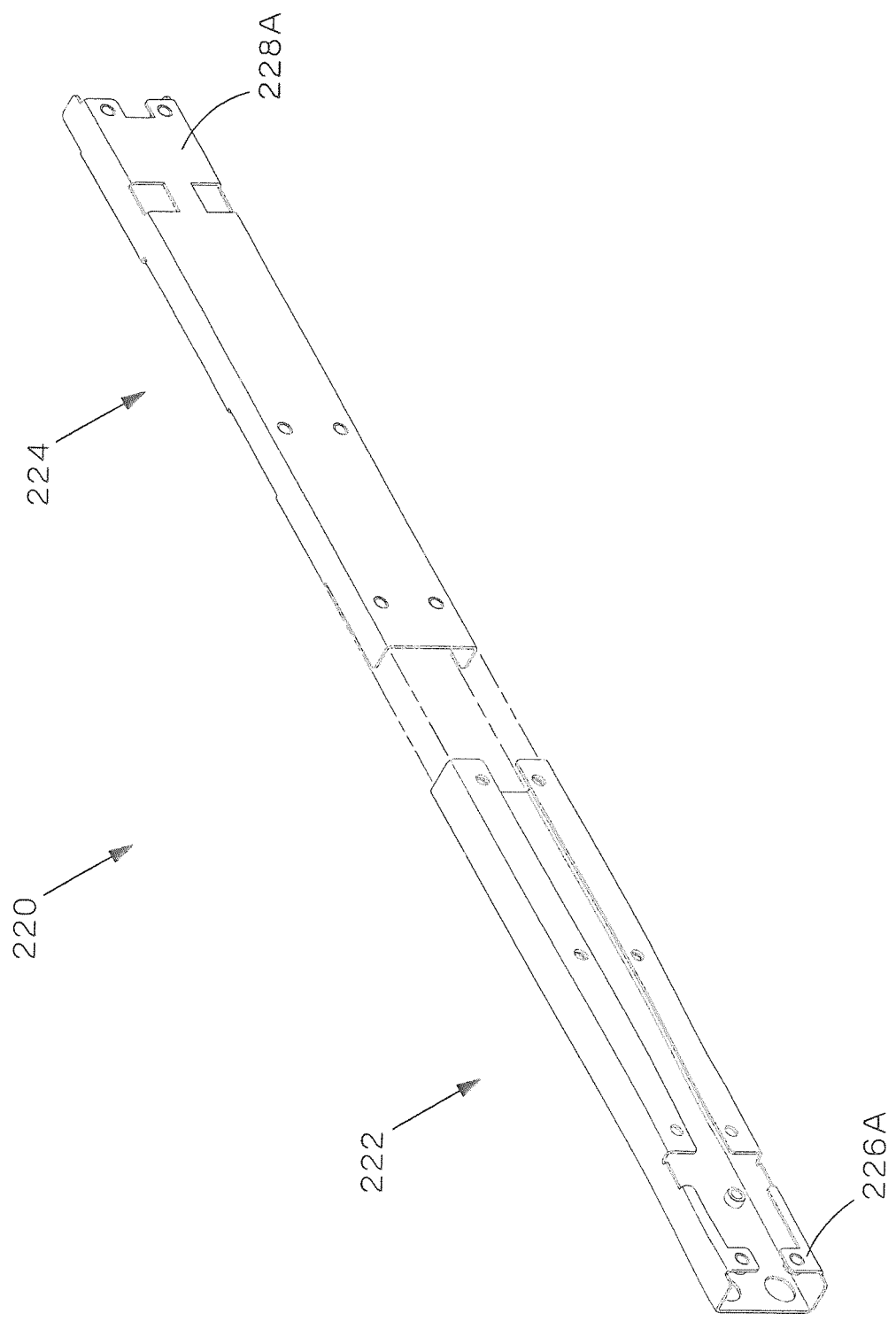
FIG. 22 is an exploded top front perspective view of the front-to-back beams of FIGS. 17 and 20.
Figure 23:
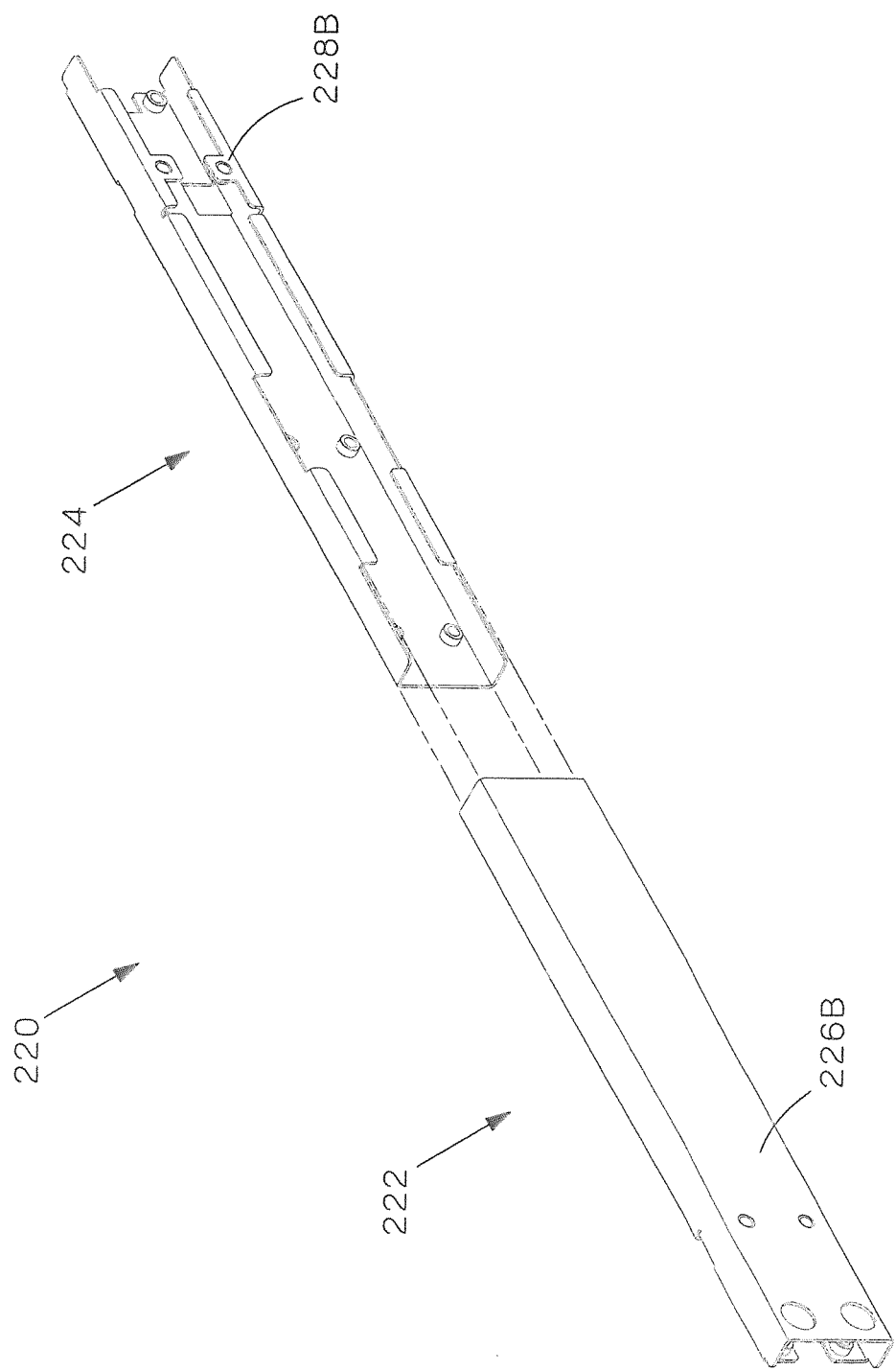
FIG. 23 is an exploded top front perspective view of the front-to-back beams of FIGS. 18 and 21.

However, unlike front-to-back beams 120, which are removably connected to vertical post 110 at a maximum-depth position (FIGS. 1-5) and a minimum-depth position (FIGS. 6-8), front-to-back beams 220 are removably connected to vertical posts 210 and telescope from a maximum-depth position (FIGS. 9-18) to a minimum-depth position (FIG. 19-21). For example, front-to-back beam 220 includes front section 222 and a back section 224 slidably connected to front section 222. Preferably, mounting surfaces 226A and 226B of front section 222 and mounting surfaces 228A and 226B of back section 224, respectively, are aligned for maintaining a uniform width of adjustable 4-post rack 200.

While adjustable 4-post rack 100 and adjustable 4-post rack 200 are both stable, adjustable 4-post rack 200 is more stable than adjustable 4-post rack 100, because, for example, front-to-back beam 220 extends into vertical post 210 and is secured to vertical post 210 at multiple locations.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. A rack for electronic equipment, the rack comprising:
    a vertical post;
    a vertical equipment rail removably connected to the vertical post; and
    a front-to-back beam removably connected to the vertical post,
    wherein the vertical post comprises a front, a back, and a first side, the front, the back, and the first side forming a channel,
    wherein the vertical equipment rail is removably connected to the front of the vertical post and the back of the vertical post and encloses the channel to form a second side of the vertical post,
    wherein the vertical post includes a first opening for receiving a first fastener to secure the vertical equipment rail to the front of the vertical post and a second opening for receiving a second fastener to secure the vertical equipment rail to the back of the vertical post, and
    wherein the front-to-back beam is removably connected to the vertical equipment rail and disposed between the vertical equipment rail and the vertical post.

2. The rack of claim 1, wherein the vertical equipment rail includes a plurality of openings, each of the plurality of openings for removably connecting the electronic equipment to the rack.

3. The rack of claim 1, wherein the front-to-back beam is removably connectable to the vertical post at a first location corresponding to a first depth of the rack and a second location corresponding to a second depth of the rack.

4. The rack of claim 1, further comprising a side-to-side beam removably connected to the vertical post independent of the front-to-back beam such that the side-to-side beam remains connected to the vertical post when the front-to-back beam is removed.

5. The rack of claim 1, wherein the front-to-back beam comprises a first section and a second section slidably connected to the first section to adjust the rack from a first depth to a second depth.

6. The rack of claim 5, wherein at least a portion of the first section nests within at least a portion of the second section.

7. The rack of claim 6, wherein the first section comprises a first surface for removably connecting the front-to-back beam to the vertical post and the second section comprises a second surface for removably connecting the front-to-back beam to a second vertical post such that the first surface and the second surface are aligned when the first section and the second section are nested.

8. A rack for electronic equipment, the rack comprising:
    a vertical post;
    a vertical equipment rail removably connected to the vertical post; and
    a front-to-back beam removably connected to the vertical post,
    wherein the front-to-back beam is removably connectable to the vertical post at a first location corresponding to a first depth of the rack and a second location corresponding to a second depth of the rack,
    wherein the vertical post comprises a front, a back, and a first side, the front, the back, and the first side forming a channel,
    wherein the vertical equipment rail is removably connected to the front of the vertical post and the back of the vertical post and encloses the channel to form a second side of the vertical post,
    wherein the vertical post includes a first opening for receiving a first fastener to secure the vertical equipment rail to the front of the vertical post and a second opening for receiving a second fastener to secure the vertical equipment rail to the back of the vertical post, and
    wherein the front-to-back beam is removably connected to the vertical equipment rail.

9. The rack of claim 8, wherein the vertical equipment rail includes a plurality of openings, each of the plurality of openings for removably connecting the electronic equipment to the rack.

10. The rack of claim 8, further comprising a side-to-side beam removably connected to the vertical post independent of the front-to-back beam such that the side-to-side beam remains connected to the vertical post when the front-to-back beam is removed.

11. The rack of claim 8, wherein the front-to-back beam comprises a first section and a second section slidably connected to the first section to adjust the rack from a first depth to a second depth.

12. The rack of claim 11, wherein at least a portion of the first section nests within at least a portion of the second section.

13. The rack of claim 12, wherein the first section comprises a first surface for removably connecting the front-to-back beam to the vertical post and the second section comprises a second surface for removably connecting the front-to-back beam to a second vertical post such that the first surface and the second surface are aligned when the first section and the second section are nested.

* * * * *